United States Patent
Hong et al.

(10) Patent No.: US 10,381,286 B2
(45) Date of Patent: Aug. 13, 2019

(54) POWER MODULE

(71) Applicant: Delta Electronics (Shanghai) Co., Ltd., Shanghai (CN)

(72) Inventors: Shou-Yu Hong, Shanghai (CN); Gan-Yu Zhou, Shanghai (CN); Jian-Hong Zeng, Shanghai (CN); Zhen-Qing Zhao, Shanghai (CN)

(73) Assignee: DELTA ELECTRONICS (SHANGHAI) CO., LTD., Shanghai (CN)

(*) Notice: Subject to any disclaimer, the term of this patent is extended or adjusted under 35 U.S.C. 154(b) by 0 days.

(21) Appl. No.: 15/671,132

(22) Filed: Aug. 7, 2017

(65) Prior Publication Data
US 2017/0358516 A1 Dec. 14, 2017

Related U.S. Application Data

(63) Continuation of application No. 14/330,045, filed on Jul. 14, 2014, now abandoned.

(30) Foreign Application Priority Data

Sep. 23, 2013 (CN) .......................... 2013 1 0435466

(51) Int. Cl.
| | |
|---|---|
| *H01L 23/373* | (2006.01) |
| *H01L 23/36* | (2006.01) |
| *H01L 23/498* | (2006.01) |
| *H01L 23/433* | (2006.01) |
| *H01L 23/495* | (2006.01) |
| *H01L 25/07* | (2006.01) |
| *H05K 1/02* | (2006.01) |

(52) U.S. Cl.
CPC .......... *H01L 23/3735* (2013.01); *H01L 23/36* (2013.01); *H01L 23/4334* (2013.01); (Continued)

(58) Field of Classification Search
CPC ............ H01L 23/13–18; H01L 23/143; H01L 23/047; H01L 23/4334; H05K 1/14; H05K 1/18
(Continued)

(56) References Cited

U.S. PATENT DOCUMENTS

| | | | |
|---|---|---|---|
| 5,077,595 A | 12/1991 | Fukunaga | |
| 5,466,969 A | 11/1995 | Tsunoda | |

(Continued)

FOREIGN PATENT DOCUMENTS

| | | |
|---|---|---|
| CN | 102340233 A | 2/2012 |
| CN | 202816924 U | 3/2013 |

(Continued)

*Primary Examiner* — Tuan T Dinh
(74) *Attorney, Agent, or Firm* — CKC & Partners Co., LLC

(57) ABSTRACT

A power module is disclosed. The power module includes a first substrate, a first metal layer, at least one conductive structure and at least one power device. The first metal layer is disposed on the first substrate. The first metal layer has a first thickness d1. The first thickness d1 satisfies: 5 μm≤d1≤50 μm. The conductive structure is disposed at a position different to the first metal layer on the first substrate. The conductive structure has a second thickness d2. The second thickness d2 satisfies: d2≥100 μm. The power device is disposed on the first substrate, the first metal layer or the conductive structure. The driving electrode of the power device is electrically connected to the first metal layer. The power electrode of the power device is electrically coupled to the conductive structure.

12 Claims, 10 Drawing Sheets

(52) U.S. Cl.
CPC .. *H01L 23/49537* (2013.01); *H01L 23/49562* (2013.01); *H01L 23/49568* (2013.01); *H01L 23/49575* (2013.01); *H01L 23/49811* (2013.01); *H01L 23/49833* (2013.01); *H01L 25/072* (2013.01); *H01L 2224/48091* (2013.01); *H01L 2224/48137* (2013.01); *H01L 2224/73265* (2013.01); *H01L 2924/13055* (2013.01); *H01L 2924/13091* (2013.01); *H01L 2924/181* (2013.01); *H05K 1/0265* (2013.01); *H05K 2201/10166* (2013.01)

(58) Field of Classification Search
USPC ........ 361/704–710, 767, 775–777, 803, 813; 257/685–730
See application file for complete search history.

(56) References Cited

U.S. PATENT DOCUMENTS

| | | | |
|---|---|---|---|
| 5,521,437 A * | 5/1996 | Oshima | H01L 23/24 257/687 |
| 5,559,374 A | 9/1996 | Ohta et al. | |
| 6,033,787 A | 3/2000 | Nagase et al. | |
| 6,291,880 B1 | 9/2001 | Ogawa et al. | |
| 7,417,198 B2 * | 8/2008 | Betz | H01L 23/047 174/536 |
| 2003/0011054 A1 | 1/2003 | Jeun et al. | |
| 2010/0148328 A1 | 6/2010 | Son et al. | |
| 2012/0061815 A1 | 3/2012 | Sontheimer et al. | |
| 2012/0319260 A1 | 12/2012 | Kim et al. | |
| 2013/0009290 A1 | 1/2013 | Lim et al. | |
| 2013/0069210 A1 * | 3/2013 | Lee | H01L 23/4334 257/666 |
| 2013/0105956 A1 * | 5/2013 | Jo | H01L 23/4334 257/676 |

FOREIGN PATENT DOCUMENTS

| | | |
|---|---|---|
| JP | 2013-74199 A | 4/2013 |
| TW | 200642550 A | 12/2006 |
| TW | 201216382 A | 4/2012 |
| WO | 2005/065385 A3 | 4/2006 |
| WO | 2012157583 A1 | 11/2012 |

\* cited by examiner

POWER MODULE

RELATED APPLICATIONS

The present application is a continuation of the U.S. application Ser. No. 14/330,045, filed Jul. 14, 2014, which claims priority to China Application Serial Number 201310435466.X, filed Sep. 23, 2013, all of which are herein incorporated by reference.

BACKGROUND

Technical Field

Embodiments of the present invention relate to a power module. More particularly, embodiments of the present invention relate to a power module for a power converter.

Description of Related Art

A semiconductor power device is an indispensable part in a conventional power converter. Power density of a power device corresponds to an output power of the power module per unit volume. For the same output power, the higher the power density, the smaller the power module, so less space is occupied. Therefore, having a high power density has always been an industrial requirement for power modules. To increase the power density of a power device, an integrated power module (IPM) is developed. The IPM integrates a number of semiconductor devices into a package, so high output power can be achieved with a small volume, ultimately increasing the power density.

Most of the current IPMs utilize direct bonded cooper (DBC) substrates. During the manufacturing process of such substrate, a high-temperature sintering process is applied to a ceramic tile and a sheet of copper. A copper layer formed by the sintering process can then be etched to form conductive tracks. However the high-temperature sintering process requires high energy consumption and therefore does not meet the trend of energy-saving. Further, the power module has a high requirement for flow capacity, so the copper layer of the DBC substrate generally requires being thicker than 0.1 millimeters (mm). However, as the copper layer gets thicker, the copper layer needs to be eroded deeper for etching. Due to etching's isotropic characteristics, a lateral etching of the copper layer becomes wider as the copper layer is being eroded deeper. Through such operation, widths of the conductive tracks and gaps between the conductive tracks are increased, meaning the widths of the conductive tracks and the gaps between the conductive tracks are constrained to a certain degree. Consequently the layout area of the electrical circuit per unit volume is decreased. On the other hand, in situations where an even higher current carrying capacity is desired, a thicker copper layer, such as one having a thickness of 0.5 mm, is usually required. However, such thickness is difficult to achieve, due to the coefficient of thermal expansion (CTE) of the high-temperature sintering process for DCB substrates. As a result, the output power of the power module per unit volume is reduced, thereby causing the power density of the power module to drop.

SUMMARY

The present invention provides a power module. The power module comprises a first substrate, a first metal layer, at least one conductive structure, at least one power device. The first metal layer is disposed on the first substrate. The first metal layer has a first thickness d1. The first thickness d1 satisfies: 5 µm≤d1≤50 µm. The at least one conductive structure is disposed at a position different to the first metal layer on the first substrate. The conductive structure has a second thickness d2. The second thickness d2 satisfies: d2≥100 µm. The at least one power device is disposed on the first substrate, the first metal layer or the conductive structure. The driving electrode of the power device is electrically coupled to the first metal layer, and at least one power electrode of the power device is electrically coupled to the conductive structure.

An aspect of the present invention provides a power module. The power module comprises a first substrate, a first metal layer, at least a conductive structure, a driving component and at least a power device. The first metal layer is disposed on the first substrate. The first metal layer has a first thickness d1. The first thickness d1 satisfies: 5 µm≤d1≤50 µm. The conductive structure is disposed at a position different to the first metal layer on the first substrate. The conductive structure has a second thickness d2. The second thickness d2 satisfies: d2≥100 µm. The driving component is disposed on the first substrate or the first metal layer. The at least one power device is disposed on the first substrate, the first metal layer or the conductive structure. The driving electrode of the power device is electrically coupled to the driving component, and the at least one power electrode of the power device is electrically coupled to the conductive structure.

In summary, a driving electrode of the power device is electrically coupled to the first metal layer or a driving component on the first metal layer. The gap within the first metal layer is formed by isotropic etching, and since the thickness of the first metal layer is merely between 5 µm and 50 µm, a width of the lateral etching is not too large, thereby effectively reducing a size of the gap of the first metal layer. Through such operation, the gap of the first metal layer can be narrower than the gap between wiring routes of a conventional direct bonded cooper (DBC) substrate. As a result the layout density per unit area can be increased, thus increasing the power density.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
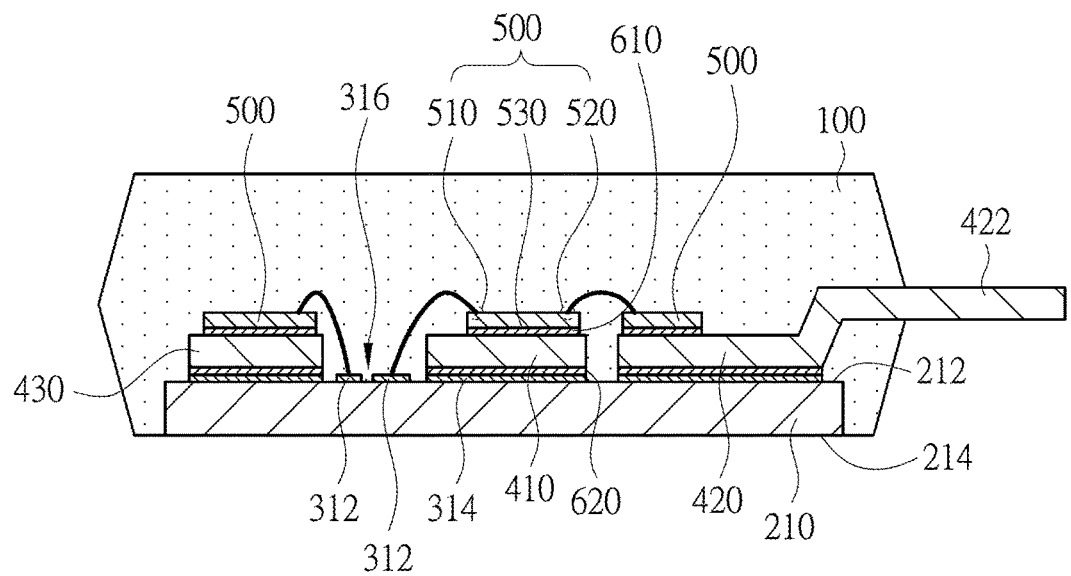
FIG. 1 is a diagram illustrating a cross-sectional view of a power module according to a first embodiment of the present invention.

Reference will now be made in detail to the present embodiments of the invention, examples of which are illustrated in the accompanying drawings. Wherever possible, the same reference numbers are used in the drawings and the description to refer to the same or like parts.

First Embodiment

FIG. 1 is a diagram illustrating a cross-sectional view of a power module according to a first embodiment of the present invention. As shown in FIG. 1, the power module comprises a sealing body 100 and a first substrate 210. A first metal layer 312, a second metal layer 314, conductive structures 410, 420 and 430, and at least one power device 500 are disposed on the first substrate 210. The first substrate 210 is disposed in the sealing body 100. The sealing body 100 covers at least the first metal layer 312, the conductive structures 410 and 430, a part of the conductive structure 420 and the power device 500 for protection. The conductive structure 420 has an exposed part 422. The exposed part 422 is exposed out of the sealing body 100, and electrically connects to an external device. The exposed part 422 can be realized by a lead frame, for instance. The first substrate 210 comprises a top side 212 and a bottom side 214 which are relative to each other. The first metal layer 312 is disposed on the top side 212 of the first substrate 210. The first metal layer 312 is thinner than the conductive structures 410, 420 and 430. The second metal layer 314 is disposed between the first substrate 210 and each of the conductive structures 410, 420 and 430, so as to carry the conductive structures 410, 420 and 430. The second metal layer 314 and the first metal layer 312 have the same thickness. In another embodiment, the thickness of the second metal layer 314 can be different to that of the first metal layer 312. The second metal layer 314 can be formed on the first substrate 210 via a process (e.g., etching, vapor deposition, sputtering or electroplating, etc.) independently. The second metal layer 314 can also be formed on the first substrate 210 via the same process as the first metal layer 312. In addition, the second metal layer 314 and the first metal layer 312 can be formed on the first substrate 210 via a process at the same time. The first metal layer 312 is not covered by the conductive structure 410. The first metal layer 312 is merely at a position different to the conductive structure 410 on the first substrate 210. In the other embodiment, copper paste and the first substrate 210 are sintered to form the first metal layer 312, at the same time, the copper and the first substrate 210 are sintered to form the conductive structure 410.

Practically, the first metal layer 312 and the conductive structure 410 are at the top side 212 of the first substrate, but the vertical projections of the first metal layer 312 and the conductive structure 410 on the top side 212 are not overlapped. The power device comprises a driving electrode 510 and a plurality of power electrodes 520 and 530. The driving electrode 510 and the power electrode 520 are disposed at a side, which is furthest away from the conductive structure 410, of the power device 500. The power electrode 530 is disposed at a side, which is closest to the conductive structure 410, of the power device 500. In other words, the power electrode 530 is disposed on the conductive structure 410 and is electrically connected to the conductive structure 410. The driving electrode 510 is electrically connected to the first metal layer 312. The power electrode 520 is electrically connected to the power device 500 on the conductive structure 420. The power electrode of the power device 500 on the conductive structure 420 is electrically connected to the conductive structure 420.

Since the driving electrode 510 can be wired to the first metal layer 312, the power device 500 can utilize the first metal layer 312 for circuit layouts. In the present embodiment, the first metal layer 312 is of a first thickness d1. The first thickness d1 satisfies the condition of 5 µm≤d1≤50 µm. In another embodiment, the first metal layer 312 comprising a gap 316, so the material around the gap 316 can form a routing pattern. In another embodiment, the gap 316 within the first metal layer 312 is formed by isotropic etching. Since the thickness of the first metal layer 312 is merely between 5 µm and 50 µm, the first metal layer 312 is relatively thin, so the lateral etching of the first metal layer 312 is not too large, thereby effectively reducing a size of the gap 316 of the first metal layer 312. Through such operation, the gap 316 of the first metal layer 312 can be narrower than that of a conventional direct bonded cooper (DBC) substrate, and a width of the wiring route of the first metal layer can be narrower than that of the conventional DBC substrate. As a result the layout area per unit volume can be increased, thus increasing the power density. In another embodiment, the first metal layer 312 can be formed on the first substrate 210 by utilizing processes other than etching. For instance, the first metal layer 312 can be formed on the first substrate 210 by vapor deposition, sputtering or electroplating, etc. Hence the first metal layer 312 is not affected by etching's isotropic characteristics, so the gap 316 and the width of the wiring routes can all be controlled to be even narrower. In addition, since the first metal layer 312 does not have to go through the high-temperature sintering process with the first substrate 210, the energy consumption of the manufacturing process can be reduced.

In the present embodiment, each of the conductive structure 410 has a second thickness d2. The second thickness d2 satisfies the condition of d2 100 μm, so as to meet a flow capacity requirement of the power module. On the other hand, since the gap 316 within the first metal layer 312 is directly formed by the process (such as etching, etc.) that produces the first metal layer 312, the size of the gap 316 is not affected by the thickness of the conductive structure 410. Therefore, a thicker conductive structure 410 can be utilized to achieve a higher flow capacity, without having to consider the size of the gap 316.

The first thickness d1 corresponds to a one-dimensional length of the first metal layer 312, measured in a direction of the normal of the top side 212 of the first substrate 210 which is horizontal to the first metal layer 312. Similarly, the second thickness d2 corresponds to a one-dimensional length of the conductive structure 410, measured in a direction of the normal of the top side 212 of the first substrate 210 which is horizontal to the conductive structure 410.

Figure 2:
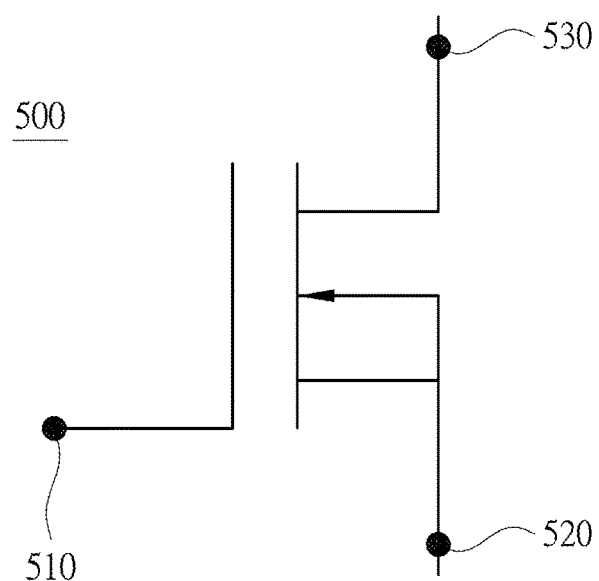
FIG. 2 is a circuit diagram illustrating a power module according to a first embodiment of the present invention.
Figure 3:
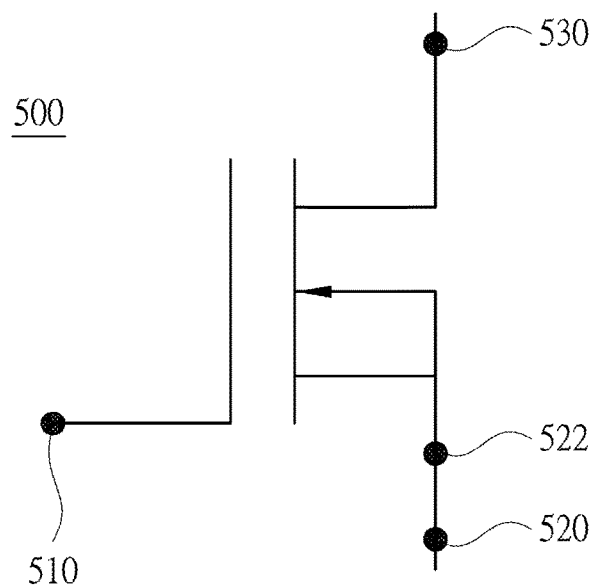
FIG. 3 is another circuit diagram illustrating a power module according to a first embodiment of the present invention.

In the present embodiment, the power device 500 can be a three-port device such as a MOSFET or an IGBT, etc., but the present invention is not limited thereto. Taking a MOSFET with 3 pins as an example, as shown in FIG. 2, the driving electrode 510 can be the gate (terminal G), the power electrode 520 can be the source (terminal S) and the power electrode 530 can be the drain (terminal D). The gate 510 and the source 520 are at a top side, which is further away from the conductive structure 410, of the MOSFET (as illustrated by FIG. 1). The drain 530 is disposed on the conductive structure 410 and is electrically connected to the conductive structure 410. A circuit that applies a voltage in between the driving electrode 510 (the gate) and the power electrode 520 (the source) is a driving circuit, where a source of the driving circuit is of the same electrode as the power electrode 520 (the source). In the present embodiment, since the driving electrode 510 is electrically connected to the first metal layer 312, at least a part of the driving circuit can be realized by the first metal layer 312. Also, since the gap 316 within the first metal layer 312 is narrower, the wiring routes of the driving circuit can be implemented even closer to each other, so as to increase a driving capability. Taking a MOSFET with 4 pins as an example, as shown in FIG. 3, the MOSFET with 4 pins differs to the MOSFET with 3 pins in that an electrode 522 is led-out from the source 520. A circuit that applies a voltage in between the driving electrode 510 (the gate) and the electrode 522 is the driving circuit. In the present embodiment, since the electrode 522 is electrically connected to the first metal layer 312, at least a part of the driving circuit can be realized by the first metal layer 312. Also, since the gap 316 within the first metal layer 312 is narrower, the wiring routes of the driving circuit can be implemented to be even closer to each other, so as to increase a driving capability.

As shown in FIG. 1, only the driving electrode 510 is electrically connected to the first metal layer 312 and the power electrode 520 is electrically connected to the power device on the conductive structure 420. In another embodiment however, the electrode 522 which is led-out from the power electrode 520 can also be electrically connected to the first metal layer 312. In other words, the driving electrode 510 and the electrode 522 which are led-out from the power electrode 520 can all be wired to the first metal layer 312, and by performing circuit layouts through the first metal layer 312, which comprises the gap 316 (i.e., the gap 316 is narrow), the power density can be increased. For instance, if the power electrode 520 is the source, the electrode 522 which is led-out from the source can be wired directly to the first metal layer 312.

In the present embodiment, the power module can further comprise a plurality of bonding structures, such as bonding layers 610 and 620. The bonding layer 610 is disposed between the power device 500 and each of the conductive structures 410, 420 and 430, so as to fix the power device 500 on the conductive structures 410, 420 and 430, as well as to electrically connect the conductive structure 410 to the power electrode 530 of the power device 500. The bonding layer 620 is disposed between the second metal layer 314 and each of the conductive structures 410, 420 and 430, so as to fix the conductive structures 410, 420 and 430 on the second metal layer 314. The bonding layers 610 and 620 can be a solder, a conductive adhesive, a conductive paste or a sintering paste, etc. Materials of the bonding layers 610 and 620 can be the same or different. For instance, the bonding layer 610 can be a solder and the bonding layer 620 can be a sintering paste. In the present embodiment, the first substrate 210 can be a ceramic substrate.

Second Embodiment

Figure 4:
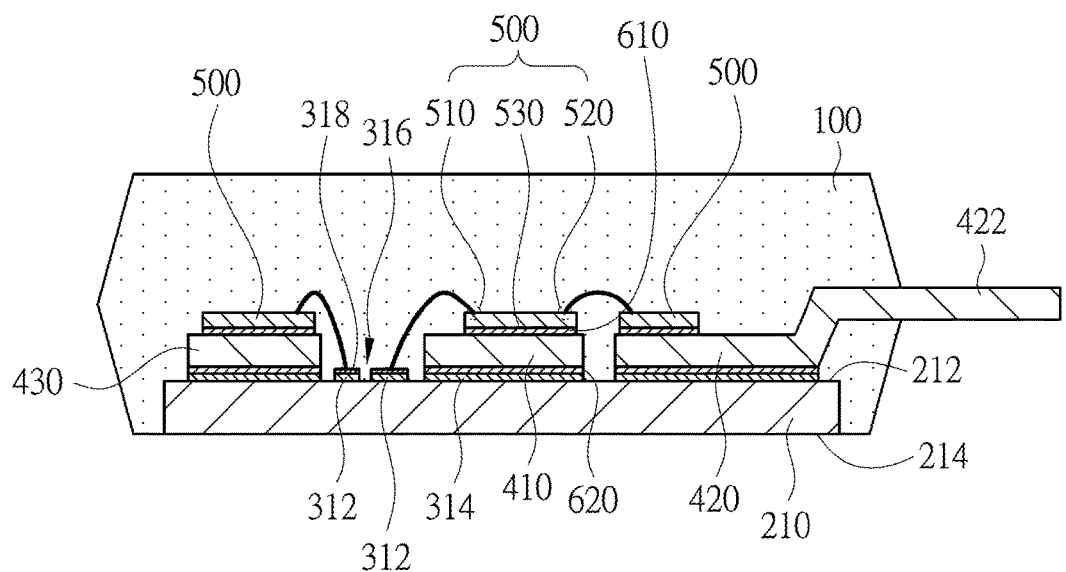
FIG. 4 is a diagram illustrating a cross-sectional view of a power module according to a second embodiment of the present invention.

FIG. 4 is a diagram illustrating a cross-sectional view of a power module according to a second embodiment of the present invention. The present embodiment differs to the first embodiment mainly in that the power module of the present embodiment further comprises a plurality of flattening structures 318. The flattening structure 318 is disposed on a surface, which is opposite to the first substrate 210, of the first metal layer 312. The flattening structure 318 has a flat upper surface, which is suitable for wirings. For instance, the flattening structure 318 can be realized by a coating of platted nickel, silver, nickel gold or platted palladium, etc., on the first metal layer 312. Other technical features of the present embodiment are similar to those of the first embodiment, so relative descriptions are omitted hereinafter.

Third Embodiment

Figure 5:
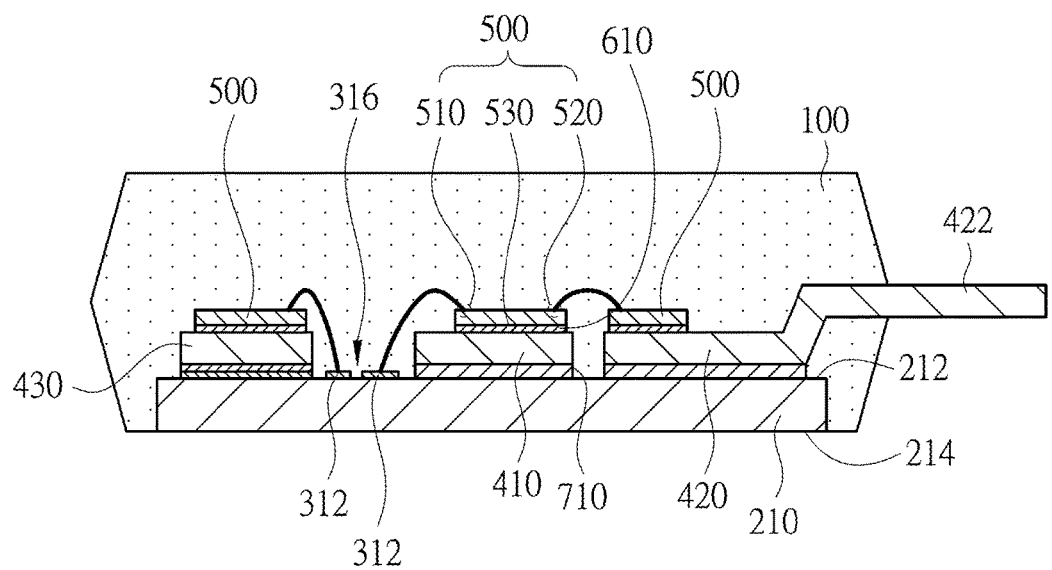
FIG. 5 is diagram illustrating a cross-sectional view of a power module according to a third embodiment of the present invention.

FIG. 5 is diagram illustrating a cross-sectional view of a power module according to a third embodiment of the present invention. The present embodiment differs to the first embodiment mainly in that the power module of the present embodiment further comprises an adhesive structure 710. The adhesive structure 710 is disposed between the conductive structure 410 and the first substrate 210, so as to conduct the heat of the conductive structure 410 to the first substrate 210. By also referring to FIG. 1 and FIG. 3 together, it can be observed that the adhesive structure 710 has replaced the second metal layer 314 and the bonding layer 620 under the conductive structure 410. Since the second metal layer 314 is omitted in the present embodiment, the manufacturing cost of the second metal layer 314 can be further saved. In the present embodiment, the adhesive structure 710 can be disposed below the conductive structure 410 so as to fill the gap between the conductive structures 410 and 420. Through such operation, the sealing body 100 and the first substrate 210 can be combined more closely by the adhesive structure 710. The adhesive structure 710 can be a thermal paste or a thermal film, etc., but the present invention is not limited thereto. Other technical features of the present embodiment are similar to those of the first embodiment, so relative descriptions are omitted hereinafter.

Fourth Embodiment

Figure 6:
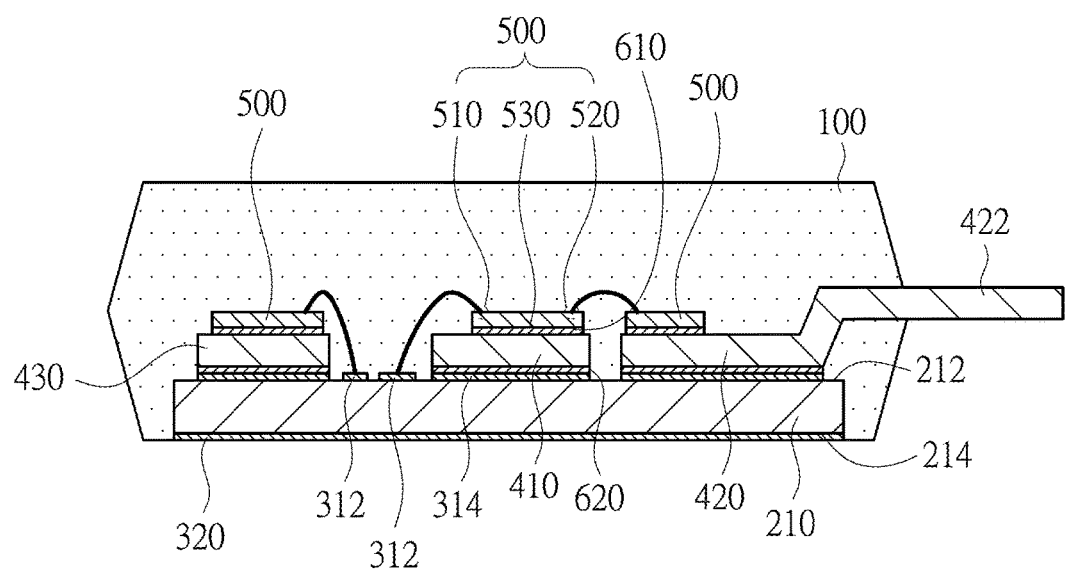
FIG. 6 is a diagram illustrating a cross-sectional view of a power module according to a fourth embodiment of the present invention.

FIG. 6 is a diagram illustrating a cross-sectional view of a power module according to a fourth embodiment of the present invention. The present embodiment differs to the first embodiment mainly in that the power module of the present embodiment further comprises a third metal layer 320. The third metal layer 320 is disposed on the bottom side 214 of the first substrate 210, so as to reduce electromagnetic noise and prevent moist infiltration. The third metal layer 320 can be a metal conductive layer which is disposed on a surface of the sealing body 100, so as to reduce electromagnetic noise and prevent moist infiltration. Other technical features of the present embodiment are similar to those of the first embodiment, so relative descriptions are omitted hereinafter.

Fifth Embodiment

Figure 7:
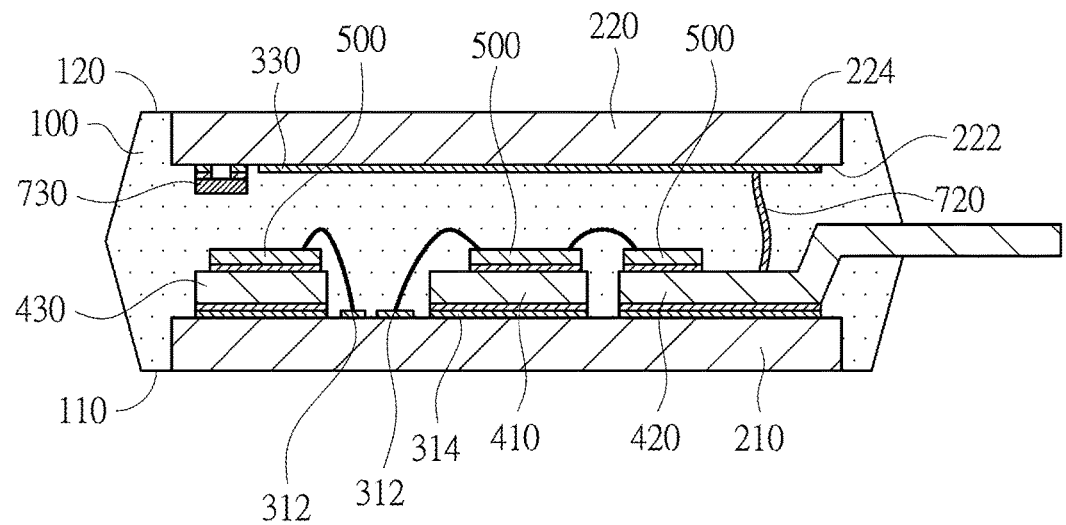
FIG. 7 is a diagram illustrating a cross-sectional view of a power module according to a fifth embodiment of the present invention.

FIG. 7 is a diagram illustrating a cross-sectional view of a power module according to a fifth embodiment of the present invention. The present embodiment differs to the first embodiment mainly in that the power module of the present embodiment further comprises a second substrate 220. The sealing body 100 comprises a bottom surface 110 and an upper surface 120 which are relative to each other. The first substrate 210 and the second substrate 220 are separated from each other. The first substrate 210 is closer to the bottom surface 110 and the second substrate 220 is closer to the upper surface 120. In other words, the first substrate 210 and the second substrate 220 are disposed within the sealing object 100 in a vertical symmetry, so as to prevent the power module from warpage or deformation.

In the present embodiment, the power module can further comprise a fourth metal layer 330. The second substrate 220 comprises a top side 222 and a bottom side 224 which are relative to each other. The top side 222 of the second substrate 220 is closer to the first substrate 210 than the bottom side 224. The fourth metal layer 330 is disposed on the top side 222 of the second substrate 220. Through such operation, the fourth metal layer 330 on the second substrate 220 can be utilized for circuit layouts, even if the first metal layer 312 does not have a sufficient area for circuit layouts. For instance, an electronic component 730 can be disposed on the fourth metal layer 330.

In the present embodiment, the power module can further comprise a connector 720. The connector 720 is electrically connected to the conductive structure 420 and the fourth metal layer 330, so the electronic component 730 on the fourth metal layer 330 can be electrically connected to the conductive structure 420. Further, the connector 720 can also support the second substrate 220 and the first substrate 210. In another embodiment, the connector 720 can also be electrically connected to the first metal layer 312 and the fourth metal layer 330. Other technical features of the present embodiment are similar to those of the first embodiment, so relative descriptions are omitted hereinafter.

Sixth Embodiment

Figure 8:
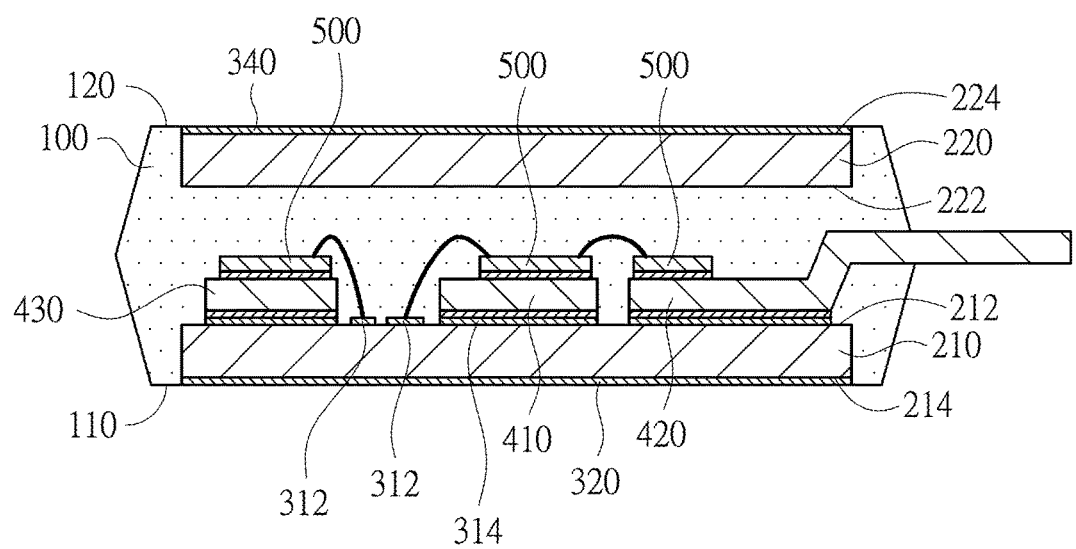
FIG. 8 is a diagram illustrating a cross-sectional view of a power module according to a sixth embodiment of the present invention.

FIG. 8 is a diagram illustrating a cross-sectional view of a power module according to a sixth embodiment of the present invention. The present embodiment differs to the fifth embodiment mainly in that the power module of the present embodiment further comprises a fifth metal layer 340. The fifth metal layer 340 is disposed on the bottom side 224 of the second substrate 220, so as to reduce electromagnetic noise and prevent moist infiltration. The fifth metal layer 340 can be a metal conductive layer, which is disposed on the surface of the sealing body 100, so as to reduce electromagnetic noise and prevent moist infiltration. Other technical features of the present embodiment are similar to those of the fifth embodiment, so relative descriptions are omitted hereinafter.

Seventh Embodiment

Figure 9:
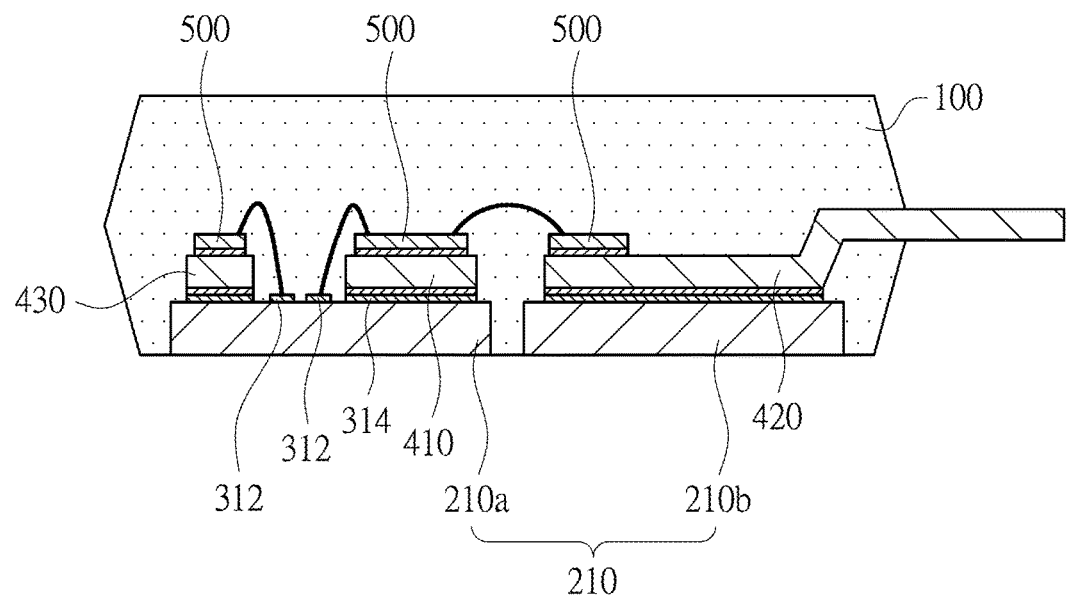
FIG. 9 is a diagram illustrating a cross-sectional view of a power module according to a seventh embodiment of the present invention.

FIG. 9 is a diagram illustrating a cross-sectional view of a power module according to a seventh embodiment of the present invention. The present embodiment differs to the first embodiment mainly in that the first substrate 210 comprises a plurality of sub-substrates 210a and 210b. The sub-substrates 210a and 210b are separated from each other. When the first substrate 210 is warped due to heat, the longer the first substrate 210 is, the higher the warpage height. Since the first substrate 210 of the present embodiment is divided to at least two separate sub-substrates 210a and 210b, the sub-substrate 210a or the sub-substrate 210b must be shorter than the whole first substrate 210. Through such operation, when the sub-substrates 210a and the sub-substrate 210b are warped due to heat, the corresponding warpage height is lower, so the warpage is reduced to a certain extent.

In the present embodiment, the first metal layer 312 is disposed on the sub-substrates 210a and 210b. The conductive structure 410 and the power device 500 can be disposed on the sub-substrate 210a, and the conductive structure 420 and the power device 500 can be disposed on the sub-substrate 210b. The power devices 500 can be electrically connected by bonding wires. Other technical features of the present embodiment are similar to those of the fifth embodiment, so relative descriptions are omitted hereinafter.

Eighth Embodiment

Figure 10:
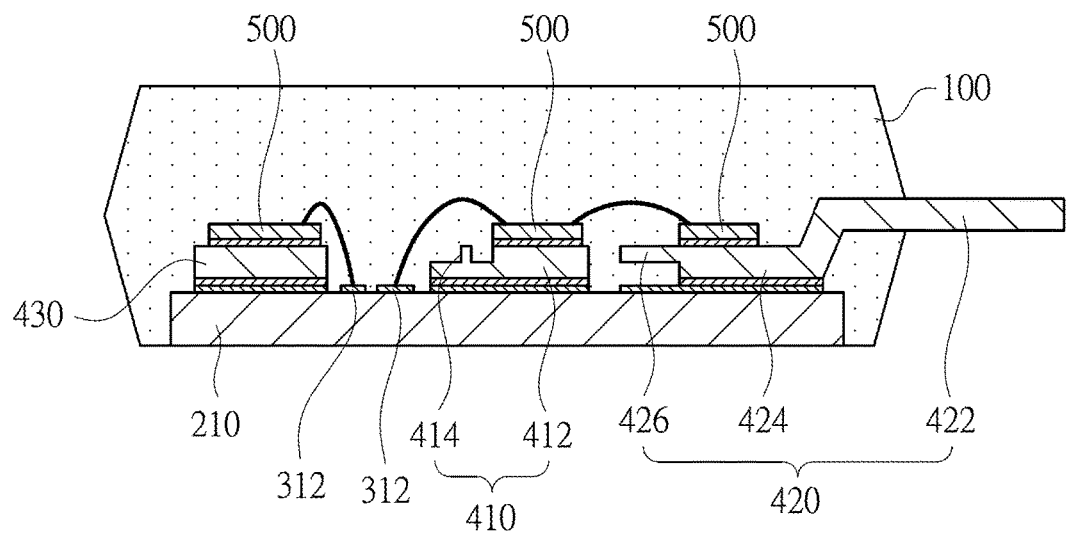
FIG. 10 is a diagram illustrating a cross-sectional view of a power module according to an eighth embodiment of the present invention.

FIG. 10 is a diagram illustrating a cross-sectional view of a power module according to an eighth embodiment of the present invention. The present embodiment differs to the first embodiment mainly in that the shapes of the conductive structures 410 and 420 are different to those of the first embodiment. More specifically, the conductive structure 410 comprises a body 412 and a locking structure 414. The sealing body 100 is fixed by the locking structure 414. More specifically, the locking structure 414 is extended out of the body 412 and is covered by the sealing body 100. Hence the locking structure 414 is fixed within the sealing body 100. In other words, the body 412 of the conductive structure 410 is not smooth without fluctuant forms, as the locking structure 414 is extended out of the body 412. Through such operation, a force that fixes the sealing body 100 and the conductive structure 410 together can be increased, so the sealing body 100 is less likely to detach from the conductive structure 410. Similarly, the conductive structure 420 also comprises a body 424 and a locking structure 426. The locking structure 426 is fixed to the sealing body 100. More specifically, the locking structure 426 is extended out of the body 424 and is fixed within the sealing body 100, so the sealing body 100 is less likely to detach from the conductive structure 420. In another embodiment, each of the locking structures 414 and 426 can be a notch, a protrusion or a cavity, etc., but the present invention is not limited thereto. Other technical features of the present embodiment are similar to those of the first embodiment, so relative descriptions are omitted hereinafter.

Ninth Embodiment

Figure 11:
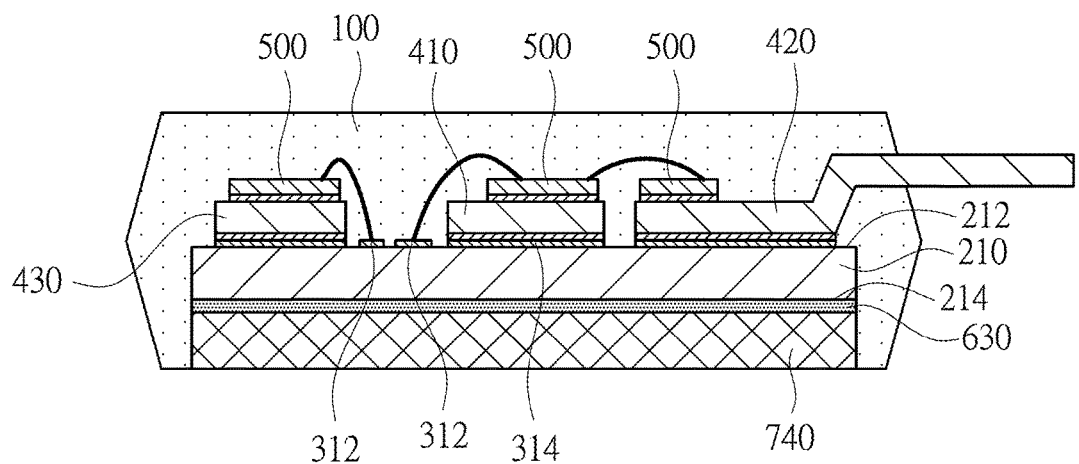
FIG. 11 is a diagram illustrating a cross-sectional view of a power module according to a ninth embodiment of the present invention.

FIG. 11 is a diagram illustrating a cross-sectional view of a power module according to a ninth embodiment of the present invention. The present embodiment differs to the first embodiment mainly in that the power module of the present embodiment further comprises a heat dissipation structure 740. The conductive structure 410 is disposed on the top side 212 of the first substrate 210. The heat dissipation structure 740 is disposed on the bottom side 214 of the first substrate 210, meaning the heat dissipation structure 740 is disposed below the first substrate 210. Through such operation, after the heat of the power device 500 on the conductive structure 410 is conducted to the first substrate 210, the heat dissipation structure 740 can then conduct the heat to an external environment.

In the present embodiment, the power module can further comprise an adhesive layer 630. The adhesive layer 630 is disposed between the bottom side 214 of the first substrate 210 and the heat dissipation structure 740, so as to fix the first substrate 210 to the heat dissipation structure 740. The adhesive layer 630 can be a thermal paste or a thermal film, etc., so the heat can be conducted to the heat dissipation structure 740 more effectively. Other technical features of the present embodiment are similar to those of the first embodiment, so relative descriptions are omitted hereinafter.

Tenth Embodiment

Figure 12:
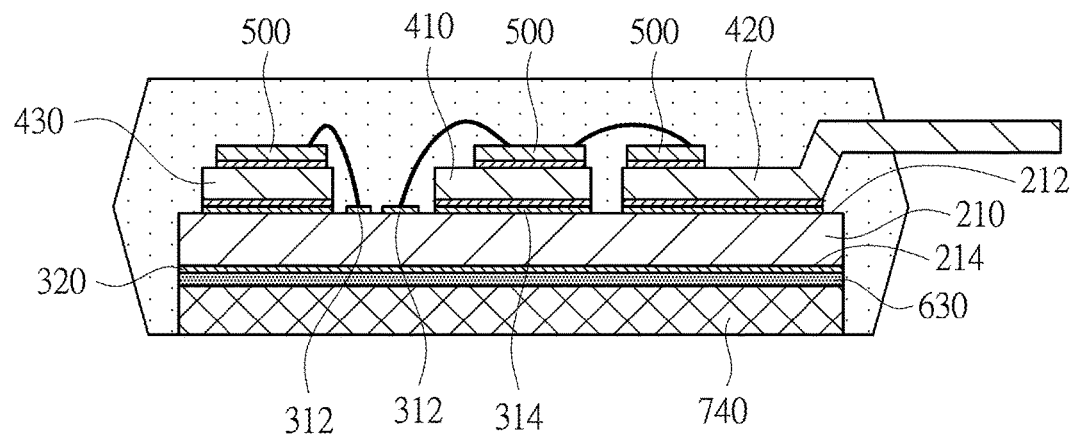
FIG. 12 is a diagram illustrating a cross-sectional view of a power module according to a tenth embodiment of the present invention.

FIG. 12 is a diagram illustrating a cross-sectional view of a power module according to a tenth embodiment of the present invention. The present embodiment differs to the ninth embodiment mainly in that the power module of the present embodiment further comprises a third metal layer 320. The third metal layer 320 is disposed at the bottom side 214 of the first substrate 210. Further, the heat dissipation structure 740 is disposed below the third metal layer 320. More specifically, the third metal layer 320 is disposed between the bottom side 214 of the first substrate 210 and the adhesive layer 630, so as to conduct the heat from the first substrate 210 to the adhesive layer 630. The third metal layer 320 can also lower the electromagnetic noise. Other technical features of the present embodiment are similar to those of the first embodiment, so relative descriptions are omitted hereinafter.

Eleventh Embodiment

Figure 13:
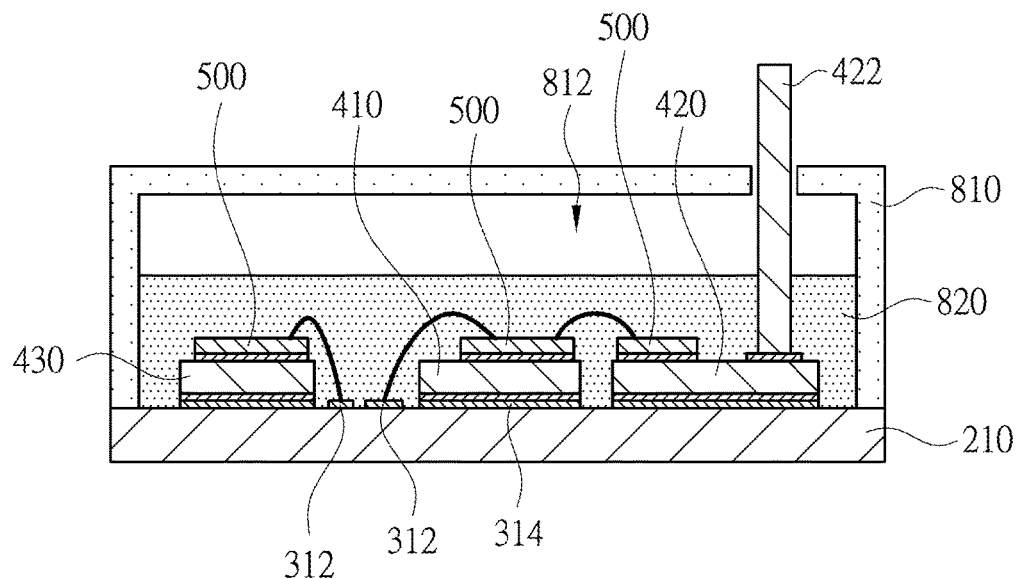
FIG. 13 is a diagram illustrating a cross-sectional view of a power module according to an eleventh embodiment of the present invention.

FIG. 13 is a diagram illustrating a cross-sectional view of a power module according to an eleventh embodiment of the present invention. The present embodiment differs to the first embodiment mainly in that the sealing body 100 in the first embodiment is replaced by a case 810 and a sealing paste 820 in the present embodiment. The case 810 is disposed on the first substrate 210 and the case 810 has an accommodating space 812. The sealing paste 820 is within the accommodating space 812. The sealing paste 820 covers at least the first metal layer 312, the conductive structures 410, 420 and 430, and the power device 500 for protection. The exposed part 422 is exposed out of the case 810. Other technical features of the present embodiment are similar to those of the first embodiment, so relative descriptions are omitted hereinafter.

Twelfth Embodiment

Figure 14:
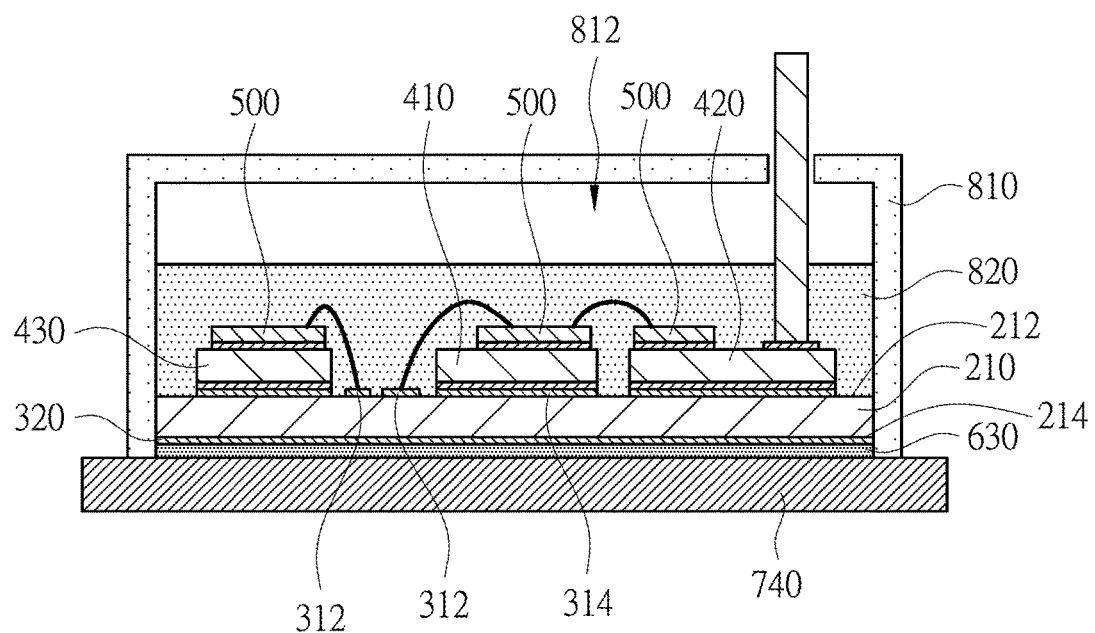
FIG. 14 is a diagram illustrating a cross-sectional view of a power module according to a twelfth embodiment of the present invention.

FIG. 14 is a diagram illustrating a cross-sectional view of a power module according to a twelfth embodiment of the present invention. The present embodiment differs to the eleventh embodiment mainly in that the power module of the present embodiment further comprises a third metal layer 320, an adhesive layer 630 and a heat dissipation structure 740. The third metal layer 320 is disposed at the bottom side 214 of the first substrate 210. The heat dissipation structure 740 is disposed below the third metal layer 320. The adhesive layer 630 is disposed between the third metal layer 320 and the heat dissipation structure 740. The case 810 is disposed on the heat dissipation structure 740. The first substrate 210, the first metal layer 312, the second metal layer 320, the conductive structures 410, 420 and 430 and the power device 500 are disposed within the accommodating space 812. The adhesive paste 820 covers at least the first substrate 210, the first metal layer 312, the conductive structures 410, 420 and 430, and the power device 500 for protection. The exposed part 422 is exposed out of the case 810. According to the above-mentioned structure, the heat generated by the power device 500 can be conducted to the heat dissipation structure 740 and the heat dissipation structure 740 can then conduct the heat to an external environment. In another embodiment, the power module can further comprise a heat dissipation structure. The heat dissipation structure is disposed below the first substrate 210 mentioned above. The case 810 is disposed on the heat dissipation structure. The first substrate 210, the first metal layer 312, the conductive structures 410, 420 and 430 and the power device 500 are disposed within the accommodating space 812. The adhesive paste 820 covers at least the first substrate 210, the first metal layer 312, the conductive structures 410, 420 and 430, and the power device 500 for protection. The heat generated by the power device 500 can be conducted to the heat dissipation structure 740, so the heat dissipation structure 740 can then conduct the heat to an external environment. Other technical features of the present embodiment are similar to those of the first embodiment and the eleventh so relative descriptions are omitted hereinafter.

Thirteenth Embodiment

Figure 15:
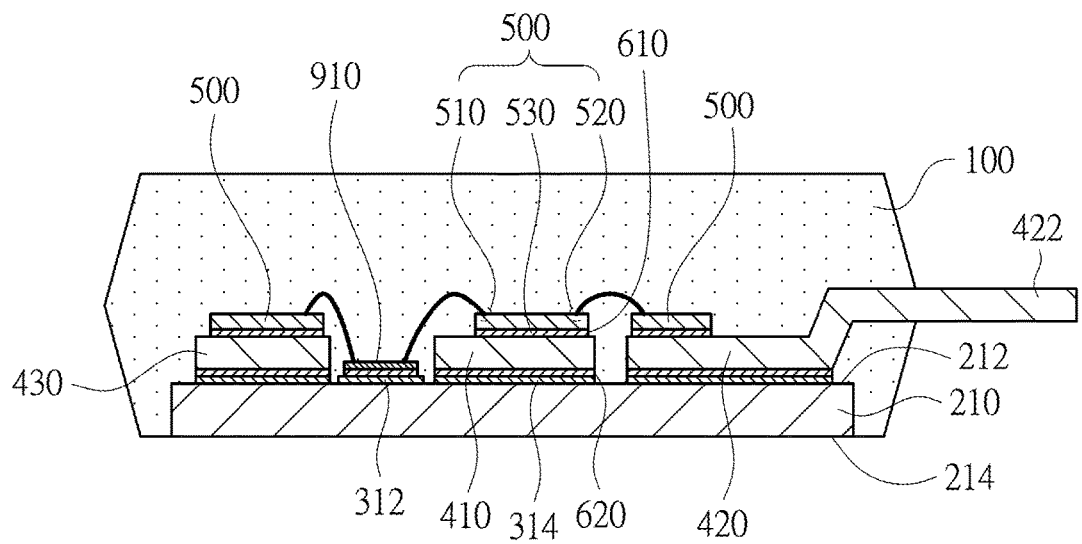
FIG. 15 is a diagram illustrating a cross-sectional view of a power module according to a thirteenth embodiment of the present invention.

FIG. 15 is a diagram illustrating a cross-sectional view of a power module according to a thirteenth embodiment of the present invention. The present embodiment differs to the first embodiment mainly in that the power module of the present embodiment can further comprise a driving component 910. The driving component 910 is disposed on the first metal layer 312. The driving electrode 510 of the power device 500 is electrically connected to an output electrode of the driving component 910. The driving component 910 can be a driving chip, which drives the power device 500 through the driving electrode 510. In other words, in the present embodiment, the driving electrode 510 of the power device 500 can be wired directly to the driving component 910. Although only one driving component 910 is illustrated in FIG. 15, a number of the driving component 910 is not limited to one. There can be a plurality of driving components 910 and the present invention is not limited thereto. One driving component can correspond to one power device 500, or to a plurality of power device 500. In another embodiment, when a lower surface of the driving component 910 is not electrically led-out, the driving component 910 can be disposed directly on the first substrate 210. An electrode on an upper surface of the driving component 910 can be electrically connected to the first metal layer 312 via methods such as conjunction wirings, etc., and the driving electrode 510 of the power device 500 can be wired directly to the first metal layer 312. Through such operation, a driving circuit can be formed. In another embodiment, the driving electrode 510 of the power device 500 and the driving component 910 can be electrically connected by wiring to the first metal layer 312 respectively. In another embodiment, the driving component 910 can also be replaced by a controlling component. The controlling component can be a controller chip, which controls the power device 500 via the driving electrode 510. The controlling component can be disposed on the first metal layer 312 or on the first substrate 210. An output electrode of the controlling component can be electrically connected to the driving electrode 510 of the power device 500, so as to control the power device 500. Other technical features of the present embodiment are similar to those of the first embodiment, so relative descriptions are omitted hereinafter.

Fourteenth Embodiment

Figure 16:
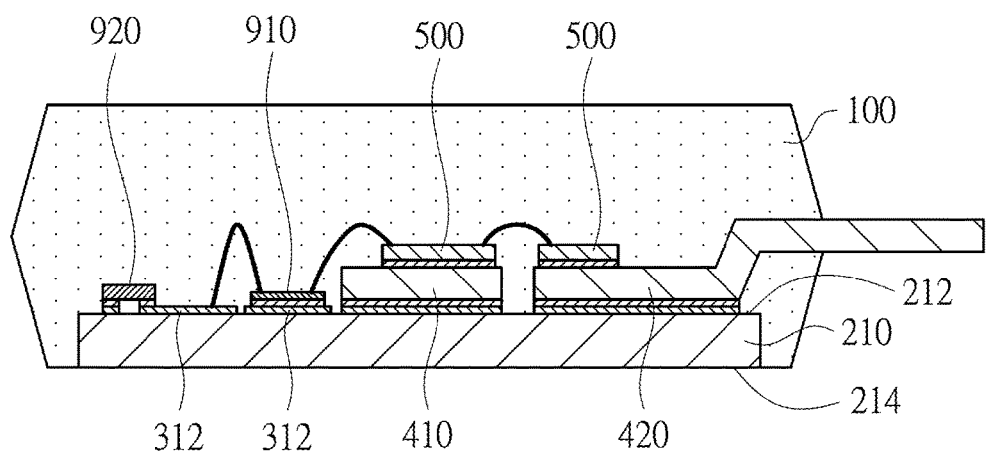
FIG. 16 is a diagram illustrating a cross-sectional view of a power module according to a fourteenth embodiment of the present invention.

FIG. 16 is a diagram illustrating a cross-sectional view of a power module according to a fourteenth embodiment of the present invention. The present embodiment differs to the thirteenth embodiment mainly in that the power module of the present embodiment can further comprise a passive component 920. The passive component 920 is disposed on the first substrate 210. More specifically, the passive component 920 is disposed on the first metal layer 312 and is electrically connected to the driving component 910. The passive component 920 can be a capacitor, a resistor, a diode or an inductor, etc., but the present invention is not limited thereto. Although only one passive component 920 is illustrated in FIG. 16, a number of the passive component 920 is not limited to one. There can be a plurality of passive components 920 and the present invention is not limited thereto. Other technical features of the present embodiment are similar to those of the first embodiment and the thirteenth embodiment, so relative descriptions are omitted hereinafter.

Fifteenth Embodiment

Figure 17:
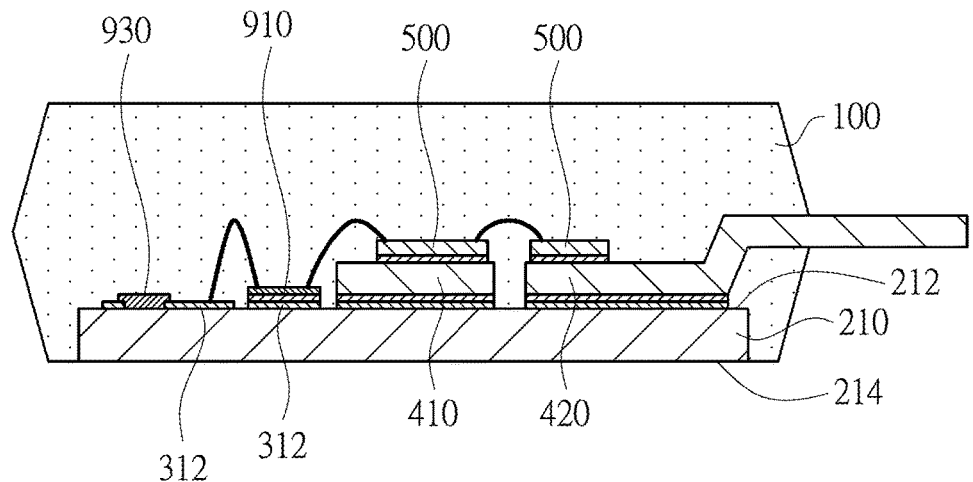
FIG. 17 is a diagram illustrating a cross-sectional view of a power module according to a fifteenth embodiment of the present invention.

FIG. 17 is a diagram illustrating a cross-sectional view of a power module according to a fifteenth embodiment of the present invention. The present embodiment differs to the fourteenth embodiment mainly in that the passive component 930 can be formed by applying/printing a material of the passive component 930 directly to the first substrate 210 and the respective electrically led-out part of the passive component 930 can be formed directly via the first metal layer 312. For instance, a resistive material can be printed on the first substrate 210 to form a resistor, where two electrodes of the resistor can be formed by covering the resistive material directly on the first metal layer 312. More specifically, a material of the first metal layer 312 is firstly printed and the resistive material is then printed to a desired location. Two ends of the resistive material cover corresponding positions of the first metal layer 312. The first metal layer 312 and the resistor can then be formed by sintering. The first metal layer 312 can also be formed first before printing the resistive material to a desired location to form a resister. In another embodiment, the resistive material can also be printed on the first metal layer 312 to form a resistor. In yet another embodiment, the resistive material can be printed on both of the first substrate 210 and the first metal layer 312 to form a resistor. Similarly, a sandwich-like structure of a metal layer/a high di-electric material layer/a metal layer can be printed onto the first metal layer 312 in an interlaced manner, so as to form a capacitor. Similarly, a sandwich-like structure of a high permeability material/a metal/a high permeability material can be printed onto the first metal layer 312 in an interlaced manner, so as to form an inductor (such method can also be utilized to form a hollow inductor or a semi-hollow inductor). Similarly, a sandwich-like structure of a metal layer/a high di-electric material layer/a metal layer can be printed onto the first substrate 210 in an interlaced manner, so as to form a capacitor. Similarly, a sandwich-like structure of a high permeability material/a metal/a high permeability material can be printed onto the first substrate 210 in an interlaced manner, so as to form an inductor. In another embodiment, a sandwich-like structure of a metal layer/a high di-electric material layer/a metal layer can be printed onto the first substrate 210 and the first metal layer 312 in an interlaced manner, so as to form a capacitor. In yet another embodiment, a sandwich-like structure of a high permeability material/a metal/a high permeability material metal layer can be printed, in an interlaced manner, onto the first substrate 210 and the first metal layer 312 to form an inductor.

In another embodiment, a plurality of metal layout layers (the metal layout layers can be designed to become different circuit patterns according to practical needs) and a plurality of insulating layers can be formed on the first substrate 210 through a printing process, meaning the metal layout layers and the insulating layers are printed, in an interlaced manner, onto the first substrate 210. A multi-layer layout can be realized by having a perforation in the insulating layer to electrically connect different locations of an upper metal wiring layer and a lower metal wiring layer (i.e., the upper and the lower metal wiring layers can be neighboring metal wiring layers or non-neighboring metal wiring layers), so as to increase the layout density. Other technical features of the present embodiment are similar to those of the first embodiment, the thirteenth embodiment and the fourteenth embodiment, so relative descriptions are omitted hereinafter.

Sixteenth Embodiment

Figure 18:
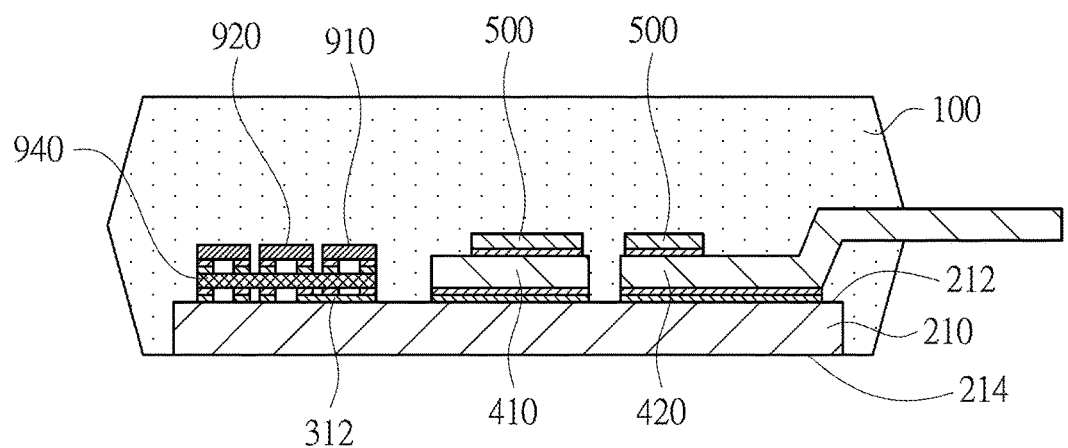
FIG. 18 is a diagram illustrating a cross-sectional view of a power module according to a sixteenth embodiment of the present invention.

FIG. 18 is a diagram illustrating a cross-sectional view of a power module according to a sixteenth embodiment of the present invention. The present embodiment differs to the thirteenth embodiment mainly in that the power module of the present embodiment can further comprise a passive component 920 and a circuit board 940. The circuit board 940 is disposed on the first metal layer 312. The driving component 910 and the passive component 920 are disposed on the circuit board 940. Since a layout density of the circuit board 940 is high, the controlling component, the driving component 910 and the passive component 920 are preferred to be disposed on the circuit board 940. Further, a material of the circuit board 940 can be a heat insulating material, which blocks the heat from flowing to the driving component 910 as the driving component 910 may be damaged by the heat. The circuit board 940 can be a printed circuit board (PCB), but the present invention is not limited thereto. Other technical features of the present embodiment are similar to those of the first embodiment and the thirteenth embodiment, so relative descriptions are omitted hereinafter.

Seventeenth Embodiment

Figure 19:
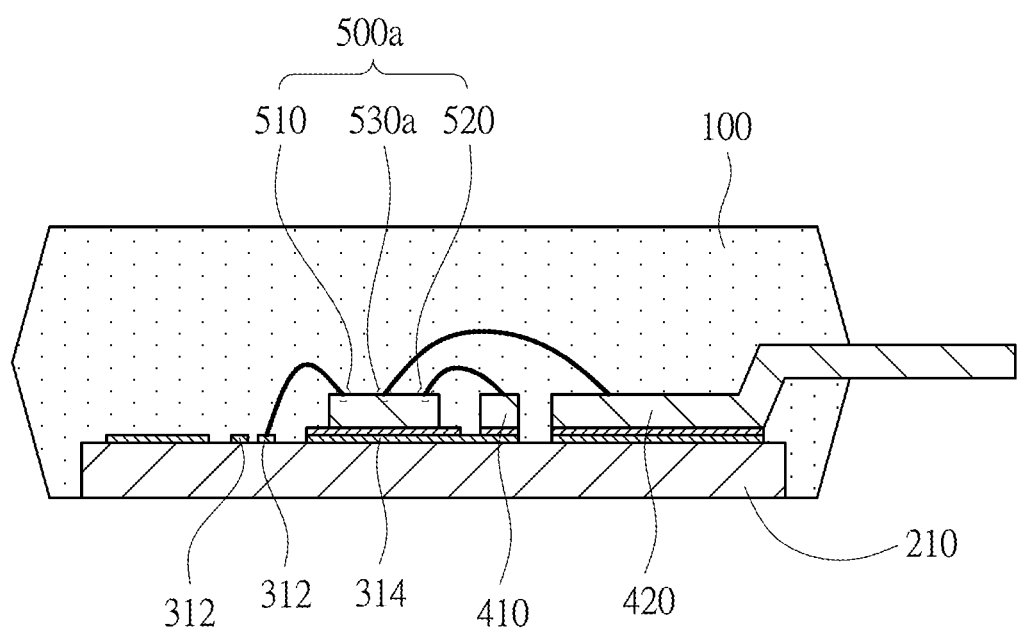
FIG. 19 is a diagram illustrating a cross-sectional view of a power module according to a seventeenth embodiment of the present invention.

FIG. 19 is a diagram illustrating a cross-sectional view of a power module according to a seventeenth embodiment of the present invention. The present embodiment differs to the previous embodiments mainly in that the power device 500a of the present embodiment is different to the power device 500 in previous embodiments. More specifically, a power electrode and a driving electrode of the power device 500a are disposed to a top side, which is furthest away from of the first substrate 210, of the power device 500. In other words, the driving electrode 510 and the power electrodes 520 and 530a are disposed on the top side of the power device 500. The driving electrode 510 can be wired to the first metal layer 312. The power electrodes 520 and 530a can be wired to the conductive structure 410 and the conductive structure 420 respectively. In another embodiment, since the power electrode 530a is disposed at the top side of the power device 500a, a bottom side of the power device 500a does not require a conductive structure to be implemented. Rather, the conductive structure can be disposed on the first substrate 210 directly, or can be disposed on the first metal layer directly, so as to save the cost of the conductive structure.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A power module, comprising:
a first substrate;
a first metal layer disposed on the first substrate;
a plurality of conductive structures disposed on the first substrate, wherein the conductive structures are thicker than the first metal layer;
a first power device disposed on one of the conductive structures, wherein a first power electrode of the first power device is electrically coupled to said one of the conductive structures; and
at least one controlling component or a driving component, disposed on the first metal layer over the first substrate, wherein the first metal layer is thinner than the conductive structures over the first substrate, wherein a driving electrode of the first power device is electrically coupled to an electrode of the controlling component or the driving component
a second power device disposed on the first substrate, wherein a second power electrode of the first power device is wired to the second power device, wherein the second power device is disposed on another of the conductive structures.

2. The power module of claim 1, wherein the first metal layer has a first thickness d1, the conductive structures have a second thickness d2, wherein the first thickness d1 satisfies: 5 µm≤d1≤50 µm, and the second thickness d2 satisfies: d2≥100 µm.

3. The power module of claim 1, wherein the driving electrode of the first power device is wired to the electrode of the controlling component or the driving component.

4. The power module of claim 1, further comprising:
a second metal layer disposed on the first substrate, wherein the conductive structures are disposed on the second metal layer and leaves the first metal layer uncovered, and the second metal layer has the same thickness as the first metal layer does.

5. The power module of claim 1, wherein the electrode of the controlling component or the driving component is wired to a portion of the first metal layer.

6. The power module of claim 1, further comprising:
at least one passive component disposed on the first substrate, wherein the passive component is electrically connected with the controlling component or the driving component.

7. The power module of claim 1, further comprising:
a bonding structure disposed between the first power device and said one of the conductive structures.

8. The power module of claim 1, further comprising:
a sealing body covering at least the first metal layer, a part of said another one of the conductive structures and the first power device, wherein the sealing body comprises an upper surface, a bottom surface, and a side surface connecting the upper surface and the bottom surface of the sealing body, the upper surface of the sealing body is opposite to the bottom surface of the sealing body, and the upper surface of the sealing body covers the first substrate, wherein another part of said another one of the conductive structures extends out of the sealing body from the side surface.

9. The power module of claim 6, wherein the passive component is disposed on a portion of the first metal layer.

10. The power module of claim 6, wherein the passive component is a capacitor, a resistor, a diode or an inductor.

11. The power module of claim 6, wherein the passive component is formed by printing a paste of the passive component to the first substrate and/or the first metal layer.

12. The power module of claim 7, wherein the bonding structure is a solder, a conductive adhesive, a conductive paste or a sintering paste.

* * * * *